(12) United States Patent
Kruijt-Stegeman et al.

(10) Patent No.: US 8,100,684 B2
(45) Date of Patent: *Jan. 24, 2012

(54) IMPRINT LITHOGRAPHY

(75) Inventors: Yvonne Wendela Kruijt-Stegeman, Eindhoven (NL); Johan Frederik Dijksman, Weert (NL); Aleksey Yurievich Kolesnychenko, Helmond (NL); Karel Diederick Van Der Mast, Helmond (NL); Klaus Simon, Eindhoven (NL); Raymond Jacobus Knaapen, Helmond (NL); Krassimir Todorov Krastev, Eindhoven (NL); Sander Frederik Wuister, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 12/391,954

(22) Filed: Feb. 24, 2009

(65) Prior Publication Data

US 2009/0212462 A1    Aug. 27, 2009

Related U.S. Application Data

(63) Continuation of application No. 11/312,659, filed on Dec. 21, 2005, now Pat. No. 7,517,211.

(51) Int. Cl.
*B29C 59/00* (2006.01)
*B29C 35/08* (2006.01)
*B28B 17/00* (2006.01)

(52) U.S. Cl. ............ 425/385; 425/174.4; 425/150; 264/293

(58) Field of Classification Search .......... 425/385, 425/470, 150, 174.4; 264/293
See application file for complete search history.

(56) References Cited

U.S. PATENT DOCUMENTS

| 5,512,131 | A | 4/1996 | Kumar et al. ............ 156/655.1 |
| 5,772,905 | A | 6/1998 | Chou ....................... 216/44 |
| 6,165,911 | A | 12/2000 | Calveley .................. 438/754 |
| 6,211,948 | B1 | 4/2001 | Leullau .................... 355/71 |
| 6,238,852 | B1 | 5/2001 | Klosner ................... 430/396 |
| 6,309,580 | B1 | 10/2001 | Chou ....................... 264/338 |
| 6,334,960 | B1 | 1/2002 | Willson et al. ............ 216/52 |
| 6,365,059 | B1 | 4/2002 | Pechenik .................. 216/52 |
| 6,375,870 | B1 | 4/2002 | Visovsky et al. .......... 264/1.31 |

(Continued)

FOREIGN PATENT DOCUMENTS

DE    4007716    8/1991

(Continued)

OTHER PUBLICATIONS

Notice of Reasons for Rejection for Japanese Patent Application No. 2005-367350, dated May 12, 2009.

(Continued)

*Primary Examiner* — Maria Veronica Ewald
(74) *Attorney, Agent, or Firm* — Pillsbury Winthrop Shaw Pittman LLP

(57) ABSTRACT

An imprint lithography apparatus is disclosed that has a first array of template holders, a second array of template holders, and a substrate table arranged to support a substrate to be imprinted, wherein the first array of template holders is arranged to hold an array of imprint templates that can be used to imprint a first array of patterns onto the substrate, and the second array of template holders is arranged hold an array of imprint templates that can be used to imprint a second array of patterns onto the substrate, the patterns imprinted by the second array being interspersed between the patterns imprinted by the first array.

22 Claims, 11 Drawing Sheets

U.S. PATENT DOCUMENTS

| | | | | |
|---|---|---|---|---|
| 6,416,311 | B1 | 7/2002 | Springer et al. | 425/385 |
| 6,482,742 | B1 | 11/2002 | Chou | 438/690 |
| 6,517,995 | B1 * | 2/2003 | Jacobson et al. | 430/320 |
| 6,518,189 | B1 | 2/2003 | Chou | 438/706 |
| 6,656,341 | B2 | 12/2003 | Petersson et al. | 205/667 |
| 6,671,034 | B1 | 12/2003 | Hatakeyama et al. | 355/67 |
| 6,696,220 | B2 | 2/2004 | Bailey et al. | 430/272.1 |
| 6,719,915 | B2 | 4/2004 | Willson et al. | 216/44 |
| 6,776,094 | B1 | 8/2004 | Whitesides et al. | 101/327 |
| 6,805,054 | B1 | 10/2004 | Meissl et al. | 101/483 |
| 6,890,688 | B2 | 5/2005 | Mancini et al. | 430/5 |
| 6,900,881 | B2 | 5/2005 | Sreenivasan et al. | 355/72 |
| 6,921,615 | B2 | 7/2005 | Sreenivasan et al. | 430/22 |
| 6,932,934 | B2 | 8/2005 | Choi et al. | 264/496 |
| 6,951,173 | B1 | 10/2005 | Meissl et al. | 101/483 |
| 7,027,156 | B2 | 4/2006 | Watts et al. | 356/401 |
| 7,060,402 | B2 | 6/2006 | Choi et al. | 430/22 |
| 7,070,405 | B2 | 7/2006 | Sreenivasan et al. | |
| 7,144,539 | B2 | 12/2006 | Olsson | 264/293 |
| 7,229,273 | B2 | 6/2007 | Bailey et al. | 425/385 |
| 7,309,225 | B2 | 12/2007 | McMackin et al. | 425/215 |
| 7,396,475 | B2 | 7/2008 | Sreenivasan | 216/2 |
| 7,410,904 | B2 | 8/2008 | Stasiak et al. | 438/700 |
| 7,517,211 | B2 | 4/2009 | Kruijt-Stegeman et al. | 425/385 |
| 7,636,475 | B2 | 12/2009 | Simon | |
| 7,676,088 | B2 | 3/2010 | Simon | |
| 2002/0093122 | A1 | 7/2002 | Choi et al. | 264/401 |
| 2002/0094496 | A1 | 7/2002 | Choi et al. | 430/322 |
| 2002/0132482 | A1 | 9/2002 | Chou | 438/692 |
| 2002/0167117 | A1 | 11/2002 | Chou | 264/338 |
| 2002/0177319 | A1 | 11/2002 | Chou | 438/690 |
| 2003/0034329 | A1 | 2/2003 | Chou | 216/44 |
| 2003/0080471 | A1 | 5/2003 | Chou | 264/338 |
| 2003/0080472 | A1 | 5/2003 | Chou | 264/338 |
| 2003/0081193 | A1 | 5/2003 | White et al. | 355/72 |
| 2003/0127580 | A1 | 7/2003 | Ling et al. | 249/115 |
| 2003/0139042 | A1 | 7/2003 | Heidari | 438/689 |
| 2003/0141291 | A1 | 7/2003 | Heidari et al. | 219/460.1 |
| 2003/0159608 | A1 | 8/2003 | Heidari | 101/494 |
| 2003/0170053 | A1 | 9/2003 | Montelius et al. | 399/318 |
| 2003/0189273 | A1 | 10/2003 | Olsson | 264/293 |
| 2004/0005444 | A1 | 1/2004 | Heidari | 428/212 |
| 2004/0009673 | A1 | 1/2004 | Sreenivasan et al. | 438/694 |
| 2004/0021866 | A1 | 2/2004 | Watts et al. | 356/401 |
| 2004/0022888 | A1 | 2/2004 | Sreenivasan et al. | 425/174.4 |
| 2004/0036201 | A1 | 2/2004 | Chou et al. | 264/402 |
| 2004/0046288 | A1 | 3/2004 | Chou | 264/479 |
| 2004/0051055 | A1 | 3/2004 | Kruit | 250/492.3 |
| 2004/0081798 | A1 | 4/2004 | Lee et al. | 428/141 |
| 2004/0124566 | A1 | 7/2004 | Sreenivasan et al. | 264/494 |
| 2004/0149367 | A1 | 8/2004 | Olsson et al. | 156/64 |
| 2004/0169003 | A1 | 9/2004 | Lee et al. | 216/4 |
| 2004/0192041 | A1 | 9/2004 | Jeong et al. | 438/689 |
| 2004/0200411 | A1 | 10/2004 | Willson et al. | 118/500 |
| 2004/0209470 | A1 | 10/2004 | Bajorek | 438/689 |
| 2004/0219249 | A1 | 11/2004 | Chung et al. | 425/385 |
| 2004/0219461 | A1 | 11/2004 | Chung et al. | 430/311 |
| 2005/0039618 | A1 | 2/2005 | Heidari et al. | 101/368 |
| 2005/0064054 | A1 | 3/2005 | Kasumi | 425/112 |
| 2005/0178280 | A1 | 8/2005 | Lee et al. | 101/453 |
| 2005/0184436 | A1 | 8/2005 | Jeong et al. | 264/496 |
| 2005/0189676 | A1 | 9/2005 | Sreenivasan | |
| 2006/0019183 | A1 | 1/2006 | Voisin | 430/22 |
| 2006/0035164 | A1 | 2/2006 | Schaper | 430/200 |
| 2006/0077374 | A1 | 4/2006 | Sreenivasan et al. | 355/72 |
| 2006/0137555 | A1 | 6/2006 | Simon | 101/483 |
| 2006/0144814 | A1 | 7/2006 | Kolesnychenko et al. | 216/41 |
| 2006/0147820 | A1 | 7/2006 | Colburn et al. | 430/22 |
| 2006/0159305 | A1 | 7/2006 | Simon | 382/100 |
| 2007/0102838 | A1 | 5/2007 | Simon | 264/40.1 |
| 2007/0102844 | A1 | 5/2007 | Simon et al. | 264/259 |
| 2007/0132152 | A1 | 6/2007 | Choi et al. | |
| 2008/0000375 | A1 | 1/2008 | Nielsen et al. | |
| 2010/0050893 | A1 | 3/2010 | Simon | |

FOREIGN PATENT DOCUMENTS

| | | | |
|---|---|---|---|
| JP | 52-26171 | A | 2/1977 |
| JP | 2-128337 | A | 5/1990 |
| JP | 8-51069 | A | 2/1996 |
| JP | 9-508984 | | 9/1997 |
| JP | 2001-234383 | A | 8/2001 |
| JP | 2002-91012 | A | 3/2002 |
| JP | 2002-372791 | | 12/2002 |
| JP | 2002-543582 | | 12/2002 |
| JP | 2003-287605 | A | 10/2003 |
| JP | 2004-504718 | | 2/2004 |
| JP | 2005-026462 | | 1/2005 |
| JP | 2005-045168 | | 2/2005 |
| JP | 2005-88444 | A | 4/2005 |
| JP | 2005-116022 | A | 4/2005 |
| JP | 2005-533393 | | 11/2005 |
| JP | 2007-531985 | | 11/2007 |
| JP | 2008-512274 | | 4/2008 |
| WO | WO 91/13511 | | 9/1991 |
| WO | WO 01/79591 | A1 | 10/2001 |
| WO | WO 01/79592 | A1 | 10/2001 |
| WO | WO 03/099463 | | 12/2003 |
| WO | WO 2004/086471 | | 10/2004 |
| WO | WO 2005/010986 | * | 3/2005 |

OTHER PUBLICATIONS

Stephen Y. Chou, et al., "Nanoimprint Lithography", J. Vac. Sci. Technol. B 14(6), Nov./Dec. 1996, pp. 4129-4133.

Heon Lee et al., Full Wafer Scale Near Zero Residual Nano-Imprinting Lithography Using UV Curable Monomer Solution, Microelectronic Engineering 77 (2005) pp. 42-47.

European Search Report issued for European Patent Application No. 05257614.7-1226, dated Oct. 12, 2006.

McMackin et al., "Step and Repeat UV Nanoimprint Lithography Tools and Processes," Proceedings of SPIE, vol. 5374, 2004, pp. 222-231.

Haisma et al., "Mold-assisted nanolithography: A process for reliable pattern replication," J. Vac. Sci. Technol. B 14(6), pp. 4124-4128, (Nov./Dec. 1996).

McMackin et al., "Design and Performance of a Step and Repeat Imprinting Machine," Proceedings of SPIE, vol. 5037, 2003, pp. 178-186.

English translation of Notice of Reasons for Rejection issued for JP Patent Appln. No. 2005-367350, dated Dec. 24, 2008.

Notice of Reasons for Rejection for Japanese Patent Application No. 2010-027357 dated May 6, 2010.

* cited by examiner

IMPRINT LITHOGRAPHY

The present application is a continuation of U.S. patent application Ser. No. 11/312,659 filed on Dec 21, 2005, now allowed, from which benefit is claimed under 35 U.S.C. §120. The entire contents of that application is herein fully incorporated by reference.

FIELD

The present invention relates to imprint lithography.

BACKGROUND

A lithographic apparatus is a machine that applies a desired pattern onto a target portion of a substrate. Lithographic apparatus are conventionally used, for example, in the manufacture of integrated circuits (ICs), flat panel displays and other devices involving fine structures.

It is desirable to reduce the size of features in a lithographic pattern because this allows for a greater density of features on a given substrate area. In photolithography, the increased resolution may be achieved by using radiation of shorter wavelength. However, there are problems associated with such reductions. Current systems are starting to adopt optical sources with wavelengths in the 193 nm regime but even at this level, diffraction limitations become a barrier. At lower wavelengths, e.g. extreme UV with a wave length of 13.5 nm, the transparency of materials is very poor and reflective optics must be used. As the optics only function in ultra high vacuum such optical lithography machines capable of enhanced resolutions require complex optics, ultra high vacuum systems and rare materials and are consequently very expensive.

An alternative for printing sub-100 nm features, known as imprint lithography, comprises transferring a pattern to a substrate by imprinting a pattern into an imprintable medium using a physical mould or template. The imprintable medium may be the substrate or a material coated on to a surface of the substrate. The imprintable medium may be functional or may be used as a "mask" to transfer a pattern to an underlying surface. The imprintable medium may, for instance, be provided as a resist deposited on a substrate, such as a semiconductor material, into which the pattern defined by the template is to be transferred. Imprint lithography is thus essentially a moulding process on a micrometer or nanometer scale in which the topography of a template defines the pattern created on a substrate. Patterns may be layered as with optical lithography processes so that, in principle, imprint lithography could be used for such applications as IC manufacture.

The resolution of imprint lithography is limited only by the resolution of the template fabrication process. For instance, imprint lithography may be used to produce features in the sub-50 nm range with significantly improved resolution and line edge roughness compared to that achievable with conventional optical lithography processes. In addition, imprint processes do not require expensive optics, advanced illumination sources or specialized resist materials typically required by optical lithography processes.

Current imprint lithography processes can have one or more drawbacks as will be mentioned below, particularly with regard to achieving overlay accuracy and/or high throughput. However, significant improvement in resolution and line edge roughness attainable from imprint lithography is a strong driver for addressing those and other problems.

SUMMARY

According to a first aspect of the present invention, there is provided an imprint lithography apparatus comprising a first array of template holders, a second array of template holders, and a substrate table arranged to support a substrate to be imprinted, wherein the first array of template holders is arranged to hold an array of imprint templates that can be used to imprint a first array of patterns onto the substrate, and the second array of template holders is arranged hold an array of imprint templates that can be used to imprint a second array of patterns onto the substrate, the patterns imprinted by the second array being interspersed between the patterns imprinted by the first array.

According to a second aspect of the present invention, there is provided an imprint lithography apparatus comprising a first array of template holders, a second array of template holders, and a substrate table arranged to support a substrate to be imprinted, wherein the first array of template holders is arranged to hold an array of imprint templates that can be used to imprint a first array of patterns onto the substrate, and the second array of template holders is arranged hold an array of imprint templates that can be used to imprint a second array of patterns onto the substrate, the patterns imprinted by the second array being arranged in stripes which alternate between stripes formed by patterns imprinted by the first array.

The first and second aspects of the invention may be arranged such that the entire useable surface of a substrate, or at least the majority of the usable surface, are imprinted by the imprint of the first and second arrays of imprint templates. Alternatively, third and possibly fourth suitably arranged imprint templates may in addition be used.

According to a third aspect of the present invention, there is provided an imprint lithography apparatus comprising an array of template holders, wherein a given template holder, arranged to imprint a given area, falls within a footprint which does not extend into each adjacent imprint area, but instead extends into only a subset of adjacent imprint areas.

According to a fourth aspect of the present invention, there is provided an imprint lithography apparatus comprising an array of template holders, wherein a given template holder, arranged to imprint a given area, falls within a footprint which does not extend beyond a midway point of adjacent imprint areas.

According to a fifth aspect of the present invention, there is provided a method of imprint lithography comprising imprinting a first array of patterns onto a substrate, then imprinting a second array of patterns onto the substrate, the patterns of the second array being interspersed between the patterns of the first array.

According to a sixth aspect of the present invention, there is provided an imprint template to imprint a pattern onto a substrate, the imprint template comprising a lens arranged to direct radiation through the imprint template such that the radiation reaches substantially all regions of a substrate which is to be exposed to the radiation.

According to a seventh aspect of the present invention, there is provided a support to hold an imprint template, the support comprising a lens arranged to direct radiation towards the imprint template with a desired intensity distribution.

The lens referred to in the sixth and seventh aspects of the invention may be plano-convex or plano-concave. The lens may be provided in an uppermost surface of the imprint template. The support may be arranged to hold a template holder which in turn is arranged to hold the imprint template.

According to an eighth aspect of the present invention, there is provided an imprint lithography apparatus comprising an imprint template and a substrate table arranged to support a substrate to be imprinted, wherein the imprint template is provided with at least part of an alignment system.

According to a ninth aspect of the present invention, there is provided an imprint lithography apparatus comprising a template holder and a substrate table arranged to support a substrate to be imprinted, wherein the template holder is provided with at least part of an alignment system.

The alignment system referred to in the eighth and ninth aspects of the invention may comprise an image sensor.

One or more embodiments of the present invention are applicable to any imprint lithography process in which a patterned template is imprinted into an imprintable medium in a flowable state, and for instance can be applied to hot and UV imprint lithography as described herein. For the purpose of understanding one or more embodiments of the present invention, it is not necessary to describe the imprint process in any more detail than has already been given and is known in the art.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

There are two principal approaches to imprint lithography which will be termed generally as hot imprint lithography and UV imprint lithography. There is also a third type of "printing" lithography known as soft lithography. Examples of these are illustrated in FIGS. 1a to 1c.

Figure 1A:
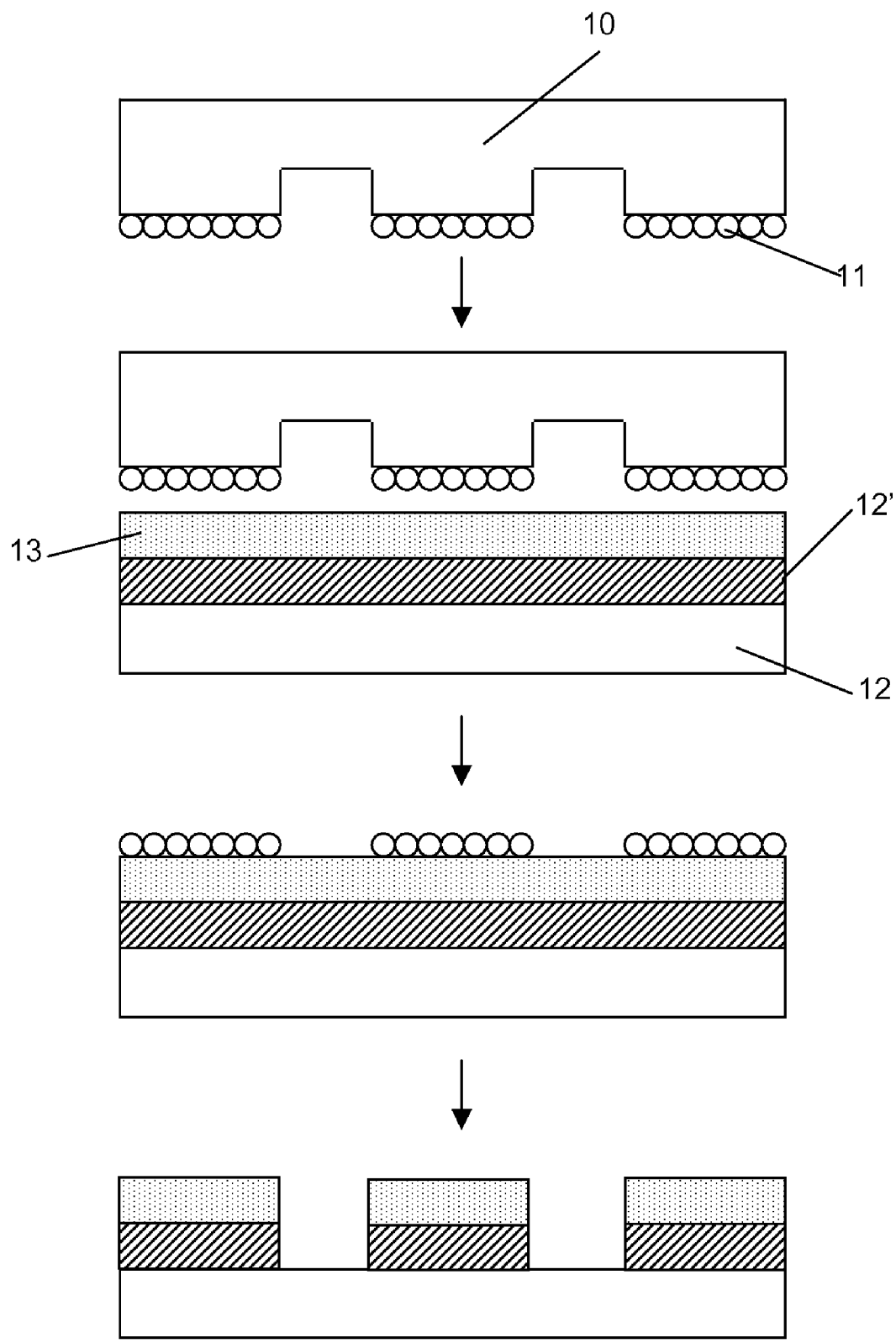
FIG. 1a-1c illustrate examples of conventional soft, hot and UV lithography processes respectively.
Figure 1B:
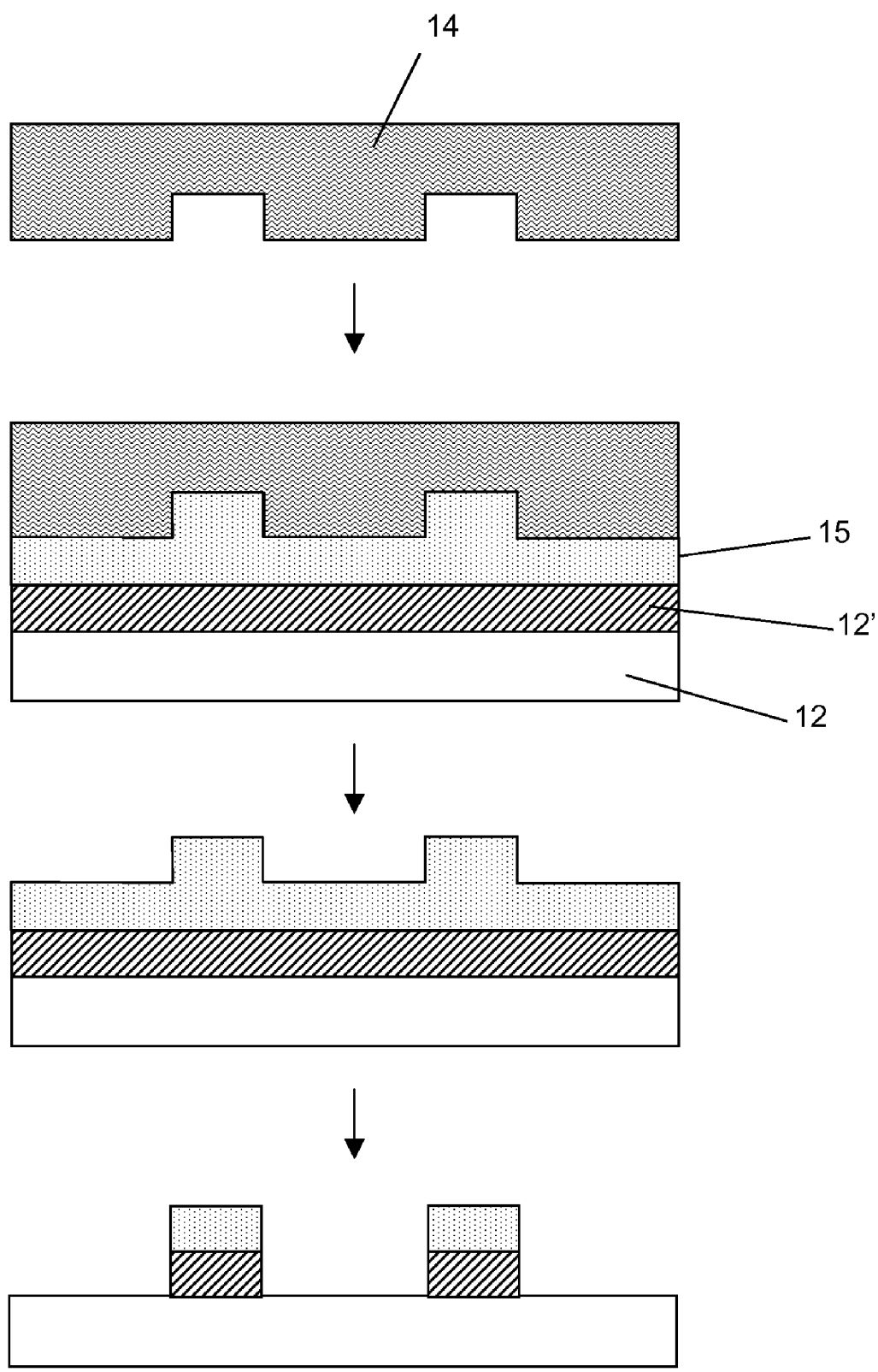
Figure 1C:
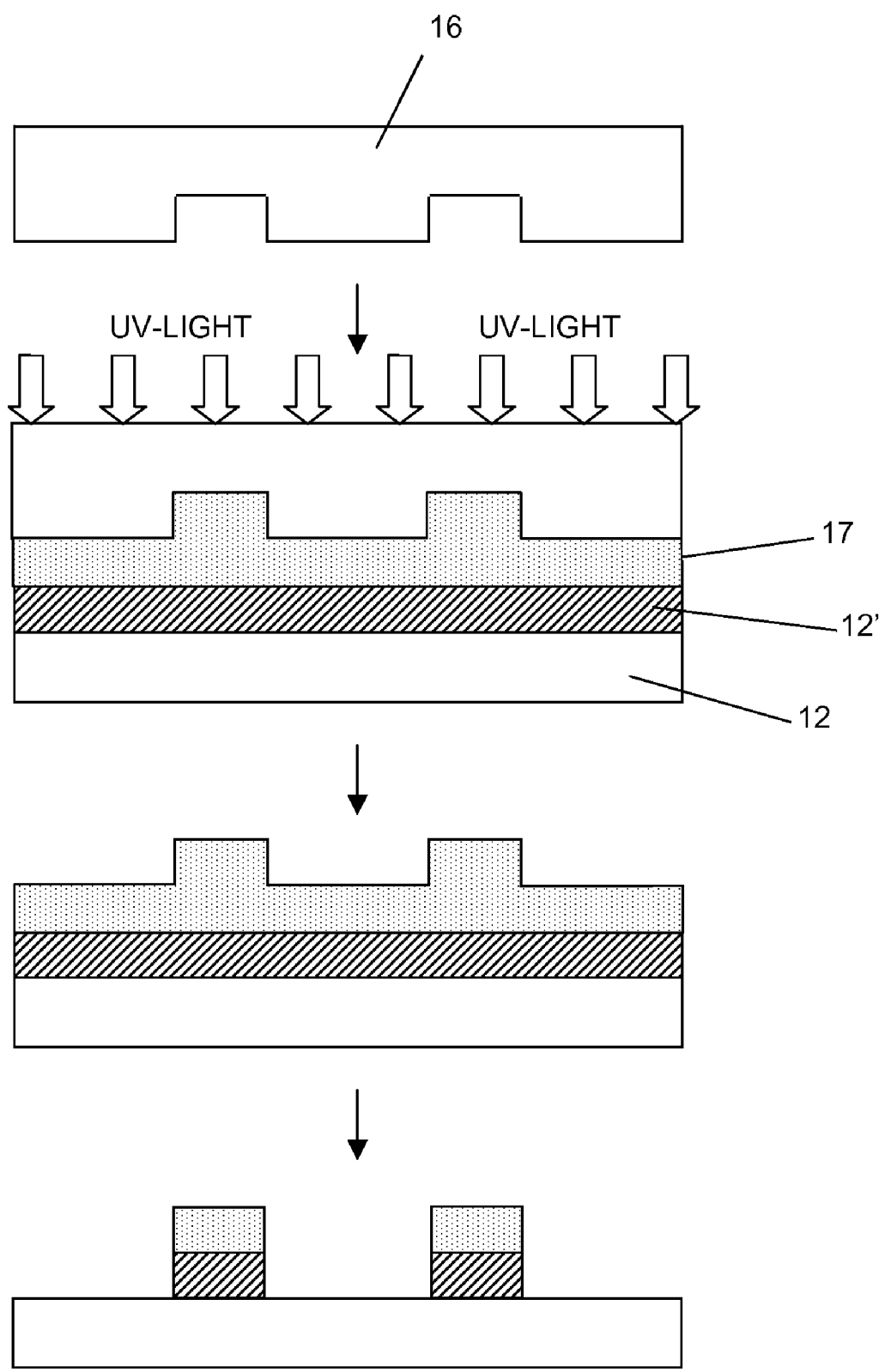

FIG. 1a schematically depicts the soft lithography process which involves transferring a layer of molecules 11 (typically an ink such as a thiol) from a flexible template 10 (typically fabricated from polydimethylsiloxane (PDMS)) onto a resist layer 13 which is supported upon a substrate 12 and planarization and transfer layer 12'. The template 10 has a pattern of features on its surface, the molecular layer being disposed upon the features. When the template is pressed against the resist layer, the layer of molecules 11 stick to the resist. Upon removal of the template from the resist, the layer of molecules 11 stick to the resist, the residual layer of resist is etched such that the areas of the resist not covered by the transferred molecular layer are etched down to the substrate.

The template used in soft lithography may be easily deformed and may therefore not be suited to high resolution applications, e.g. on a nanometer scale, since the deformation of the template may adversely affect the imprinted pattern. Furthermore, when fabricating multiple layer structures, in which the same region will be overlaid multiple times, soft imprint lithography may not provide overlay accuracy on a nanometer scale.

Hot imprint lithography (or hot embossing) is also known as nanoimprint lithography (NIL) when used on a nanometer scale. The process uses a harder template made from, for example, silicon or nickel, which are more resistant to wear and deformation. This is described for instance in U.S. Pat. No. 6,482,742 and illustrated in FIG. 1b. In a typical hot imprint process, a solid template 14 is imprinted into a thermosetting or a thermoplastic polymer resin 15, which has been cast on the surface of a substrate 12. The resin may, for instance, be spin coated and baked onto the substrate surface or more typically (as in the example illustrated) onto a planarization and transfer layer 12'. It should be understood that the term "hard" when describing an imprint template includes materials which may generally be considered between "hard" and "soft" materials, such as for example "hard" rubber. The suitability of a particular material for use as an imprint template is determined by its application requirements.

When a thermosetting polymer resin is used, the resin is heated to a temperature such that, upon contact with the template, the resin is sufficiently flowable to flow into the pattern features defined on the template. The temperature of the resin is then increased to thermally cure (e.g. crosslink) the resin so that it solidifies and irreversibly adopts the desired pattern. The template may then be removed and the patterned resin cooled.

Examples of thermoplastic polymer resins used in hot imprint lithography processes are poly (methyl methacrylate), polystyrene, poly (benzyl methacrylate) or poly (cyclohexyl methacrylate). The thermoplastic resin is heated so that it is in a freely flowable state immediately prior to imprinting with the template. It is typically necessary to heat thermoplastic resin to a temperature considerably above the glass transition temperature of the resin. The template is pressed into the flowable resin and sufficient pressure is applied to ensure the resin flows into all the pattern features defined on the template. The resin is then cooled to below its glass transition temperature with the template in place whereupon the resin irreversibly adopts the desired pattern. The pattern will consist of the features in relief from a residual layer of the resin which may then be removed by an appropriate etch process to leave only the pattern features.

Figure 2:
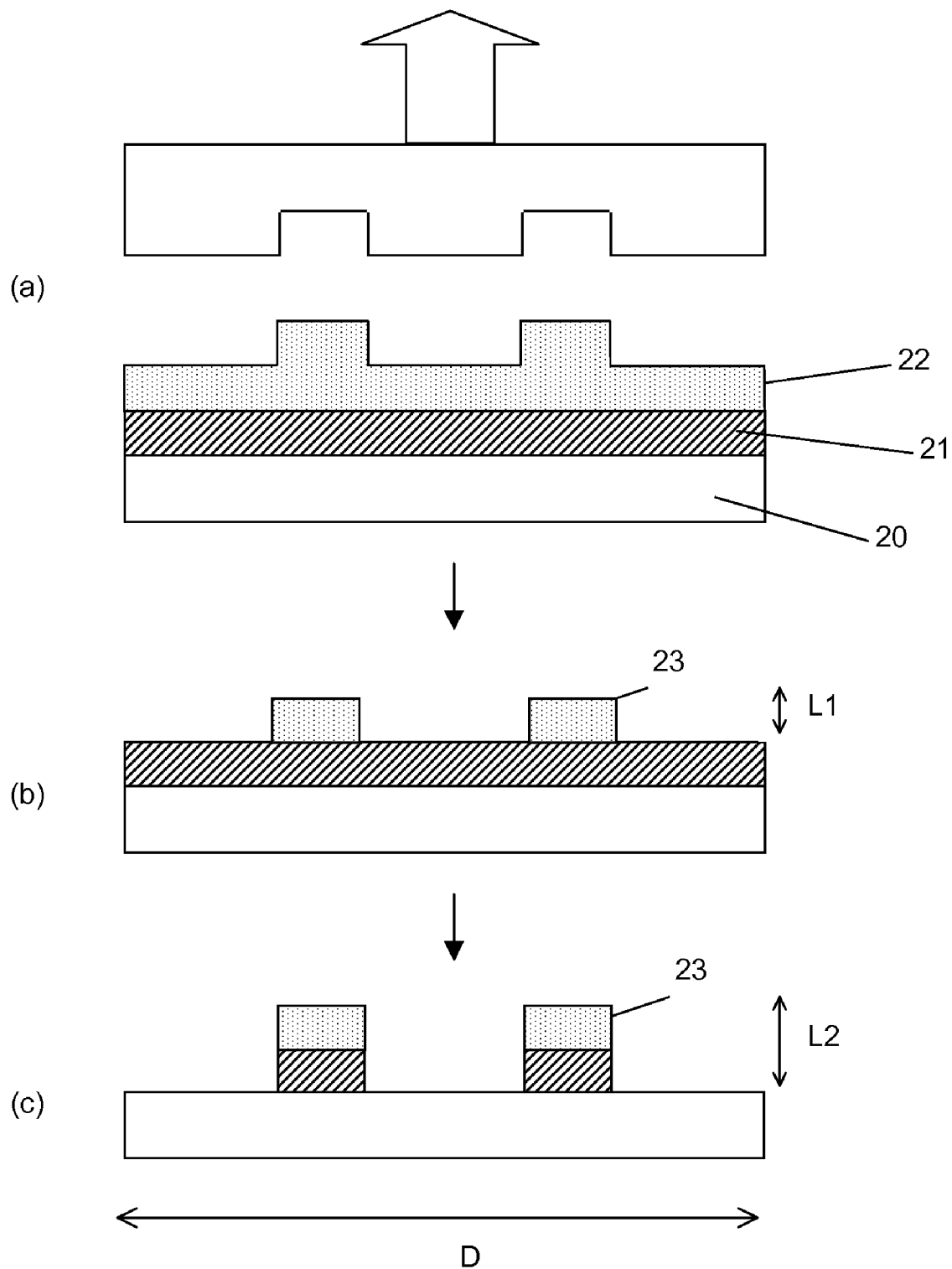
FIG. 2 illustrates a two step etching process employed when hot and UV imprint lithography is used to pattern a resist layer.

Upon removal of the template from the solidified resin, a two-step etching process is typically performed as illustrated in FIGS. 2a to 2c. The substrate 20 has a planarization and transfer layer 21 immediately upon it, as shown in FIG. 2a. The purpose of the planarization and transfer layer is twofold. It acts to provide a surface substantially parallel to that of the template, which helps ensure that the contact between the template and the resin is parallel, and also to improve the aspect ratio of the printed features, as described herein.

After the template has been removed, a residual layer 22 of the solidified resin is left on the planarization and transfer layer 21, shaped in the desired pattern. The first etch is isotropic and removes parts of the residual layer 22, resulting in a poor aspect ratio of features where L1 is the height of the features 23, as shown in FIG. 2b. The second etch is anisotropic (or selective) and improves the aspect ratio. The anisotropic etch removes those parts of the planarization and transfer layer 21 which are not covered by the solidified resin, increasing the aspect ratio of the features 23 to (L2/D), as shown in FIG. 2c. The resulting polymer thickness contrast left on the substrate after etching can be used as for instance a mask for dry etching if the imprinted polymer is sufficiently resistant, for instance as a step in a lift-off process.

Hot imprint lithography suffers from a disadvantage in that not only is the pattern transfer performed at a higher temperature, but also relatively large temperature differences might be required in order to ensure the resin is adequately solidified before the template is removed. Temperature differences between 35 and 100° C. may be needed. Differential thermal expansion between, for instance, the substrate and template may then lead to distortion in the transferred pattern. This may be exacerbated by the relatively high pressure needed for the imprinting step, due the viscous nature of the imprintable material, which can induce mechanical deformation in the substrate, again distorting the pattern.

UV imprint lithography, on the other hand, does not involve such high temperatures and temperature changes nor does it require such viscous imprintable materials. Rather, UV imprint lithography involves the use of a partially or wholly transparent template and a UV-curable liquid, typically a monomer such as an acrylate or methacrylate. for example. UV imprint lithography is discussed, for example, in J. Haisma "Mold-assisted nanolithography: A process for reliable pattern replication", J. Vac. Sci. Technol. B14(6), November/December 1996. In general, any photopolymerizable material could be used, such as a mixture of monomers and an initiator. The curable liquid may also, for instance, include a dimethyl siloxane derivative. Such materials are less viscous than the thermosetting and thermoplastic resins used in hot imprint lithography and consequently move much faster to fill template pattern features. Low temperature and low pressure operation also favors higher throughput capabilities. Although the name 'UV imprint lithography' implies that UV radiation is always used, those skilled in the art will be aware that any suitable actinic radiation may be used (for example, visible light may be used). Hence, any reference herein to UV imprint lithography, UV radiation, UV curable materials, etc. should be interpreted as including any suitable actinic radiation, and should not be interpreted as being limited to UV radiation only.

An example of a UV imprint process is illustrated in FIG. 1c. A quartz template 16 is applied to a UV curable resin 17 in a similar manner to the process of FIG. 1b. Instead of raising the temperature as in hot embossing employing thermosetting resins, or temperature cycling when using thermoplastic resins, UV radiation is applied to the resin through the quartz template in order to polymerize and thus cure it. Upon removal of the template, the remaining steps of etching the residual layer of resist are the same or similar as for the hot embossing process described herein. The UV curable resins typically used have a much lower viscosity than typical thermoplastic resins so that lower imprint pressures can be used. Reduced physical deformation due to the lower pressures, together with reduced deformation due to high temperatures and temperature changes, makes UV imprint lithography suited to applications requiring high overlay accuracy. In addition, the transparent nature of UV imprint templates can accommodate optical alignment techniques simultaneously to the imprinting.

Although this type of imprint lithography mainly uses UV curable materials, and is thus generically referred to as UV imprint lithography, other wavelengths of radiation may be used to cure appropriately selected materials (e.g., activate a polymerization or cross linking reaction). In general, any radiation capable of initiating such a chemical reaction may be used if an appropriate imprintable material is available. Alternative "activating radiation" may, for instance, include visible light, infrared radiation, x-ray radiation and electron beam radiation. In the general description herein, references to UV imprint lithography and use of UV radiation are not intended to exclude these and other activating radiation possibilities.

As an alternative to imprint systems using a planar template which is maintained substantially parallel to the substrate surface, roller imprint systems have been developed. Both hot and UV roller imprint systems have been proposed in which the template is formed on a roller but otherwise the imprint process is very similar to imprinting using a planar template. Unless the context requires otherwise, references to an imprint template include references to a roller template.

There is a particular development of UV imprint technology known as step and flash imprint lithography (SFIL) which may be used to pattern a substrate in small steps in a similar manner to optical steppers conventionally used, for example, in IC manufacture. This involves printing small areas of the substrate at a time by imprinting a template into a UV curable resin, 'flashing' UV radiation through the template to cure the resin beneath the template, removing the template, stepping to an adjacent region of the substrate and repeating the operation. The small field size of such step and repeat processes may help reduce pattern distortions and CD variations so that SFIL may be particularly suited to manufacture of IC and other devices requiring high overlay accuracy. United States patent application publication US 2004-0124566 describes in detail an example of a step and flash imprint lithography apparatus.

Although in principle the UV curable resin can be applied to the entire substrate surface, for instance by spin coating, this may be problematic due to the volatile nature of UV curable resins.

One approach to addressing this problem is the so-called 'drop on demand' ink jet type printing process in which the resin is dispensed onto a target portion of the substrate in droplets immediately prior to imprinting with the template. The liquid dispensing is controlled so that a certain volume of liquid is deposited on a particular target portion of the substrate. The liquid may be dispensed in a variety of patterns and the combination of carefully controlling liquid volume and placement of the pattern can be employed to confine patterning to the target area.

Dispensing the resin on demand as mentioned is not a trivial matter. The size and spacing of the droplets are carefully controlled to ensure there is sufficient resin to fill template features while at the same time minimizing excess resin which can be rolled to an undesirably thick or uneven residual layer since as soon as neighboring drops touch fluid, the resin will have nowhere to flow.

Although reference is made herein to depositing UV curable liquids onto a substrate, the liquids could also be deposited on the template and in general the same techniques and considerations will apply.

Figure 3:
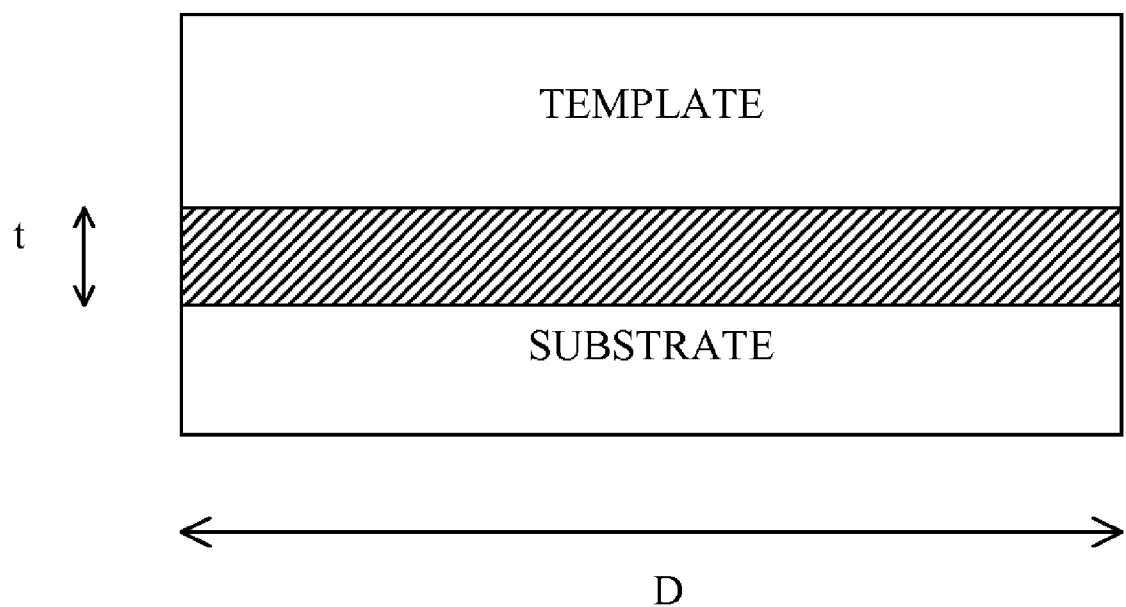
FIG. 3 schematically illustrates a template and a typical imprintable resist layer deposited on a substrate.

FIG. 3 illustrates the relative dimensions of the template, imprintable material (curable monomer, thermosetting resin, thermoplastic, etc) and substrate. The ratio of the width of the substrate, D, to the thickness of the curable resin layer, t, is of the order of $10^6$. It will be appreciated that, in order to avoid the features projecting from the template damaging the substrate, the dimension t should be greater than the depth of the projecting features on the template.

The residual layer left after stamping is useful in protecting the underlying substrate, but as mentioned herein it may also be the source of a problem, particularly when high resolution and/or minimum CD (critical dimension) variation is desired. The first 'breakthrough' etch is isotropic (non-selective) and will thus to some extent erode the features imprinted as well as the residual layer. This may be exacerbated if the residual layer is overly thick and/or uneven. This problem may, for instance, lead to variation in the thickness of lines ultimately formed in the underlying substrate (i.e. variation in the critical dimension). The uniformity of the thickness of a line that is etched in the transfer layer in the second anisotropic etch is dependant upon the aspect ratio and integrity of the shape of the feature left in the resin. If the residual resin layer is uneven, then the non-selective first etch can leave some of these features with "rounded" tops so that they are not sufficiently well defined to ensure good uniformity of line thickness in the second and any subsequent etch process. In principle, the above problem may be reduced by ensuring the residual layer is as thin as possible but this can require application of undesirably large pressures (possibly increasing substrate deformation) and relatively long imprinting times (possibly reducing throughput).

The template is a significant component of the imprint lithography system. As noted herein, the resolution of the features on the template surface is a limiting factor on the attainable resolution of features printed on the substrate. The templates used for hot and UV lithography are generally formed in a two-stage process. Initially, the desired pattern is written using, for example, electron beam writing (e.g., with an electron beam pattern generator), to give a high resolution pattern in resist. The resist pattern is then transferred into a thin layer of chrome which forms the mask for the final, anisotropic etch step to transfer the pattern into the base material of the template. Other techniques such as for example ion-beam lithography, X-ray lithography, extreme UV lithography, epitaxial growth, thin film deposition, chemical etching, plasma etching, ion etching or ion milling could be used. Generally, a technique capable of very high resolution will be used as the template is effectively a 1× mask with the resolution of the transferred pattern being limited by the resolution of the pattern on the template.

The release characteristics of the template may also be a consideration. The template may, for instance, be treated with a surface treatment material to form a thin release layer on the template having a low surface energy (a thin release layer may also be deposited on the substrate).

Another consideration in the development of imprint lithography is the mechanical durability of the template. The template may be subjected to large forces during stamping of the resist, and in the case of hot lithography, may also be subjected to extremes of pressure and temperature. This may cause wearing of the template, and may adversely affect the shape of the pattern imprinted upon the substrate.

In hot imprint lithography, there is a potential advantage in using a template of the same or similar material to the substrate to be patterned in order to reduce differential thermal expansion between the two. In UV imprint lithography, the template is at least partially transparent to the activation radiation and accordingly quartz templates are used.

Although specific reference may be made in this text to the use of imprint lithography in the manufacture of ICs, it should be understood that imprint apparatus and methods described may have other applications, such as the manufacture of integrated optical systems, guidance and detection patterns for magnetic domain memories, hard disc magnetic media, flat panel displays, thin-film magnetic heads, etc.

While in the description herein, particular reference has been made to the use of imprint lithography to transfer a template pattern to a substrate via an imprintable resin effectively acting as a resist, in some circumstances the imprintable material may itself be a functional material, for instance having a functionally such as electrical or thermal conductivity, optical linear or non-linear response, among others. For example, the functional material may form a conductive layer, a semi-conductive layer, a dielectric layer or a layer having another desirable mechanical, electrical or optical property. Some organic substances may also be appropriate functional materials. Such applications may be within the scope an embodiment of the present invention.

Figure 4:
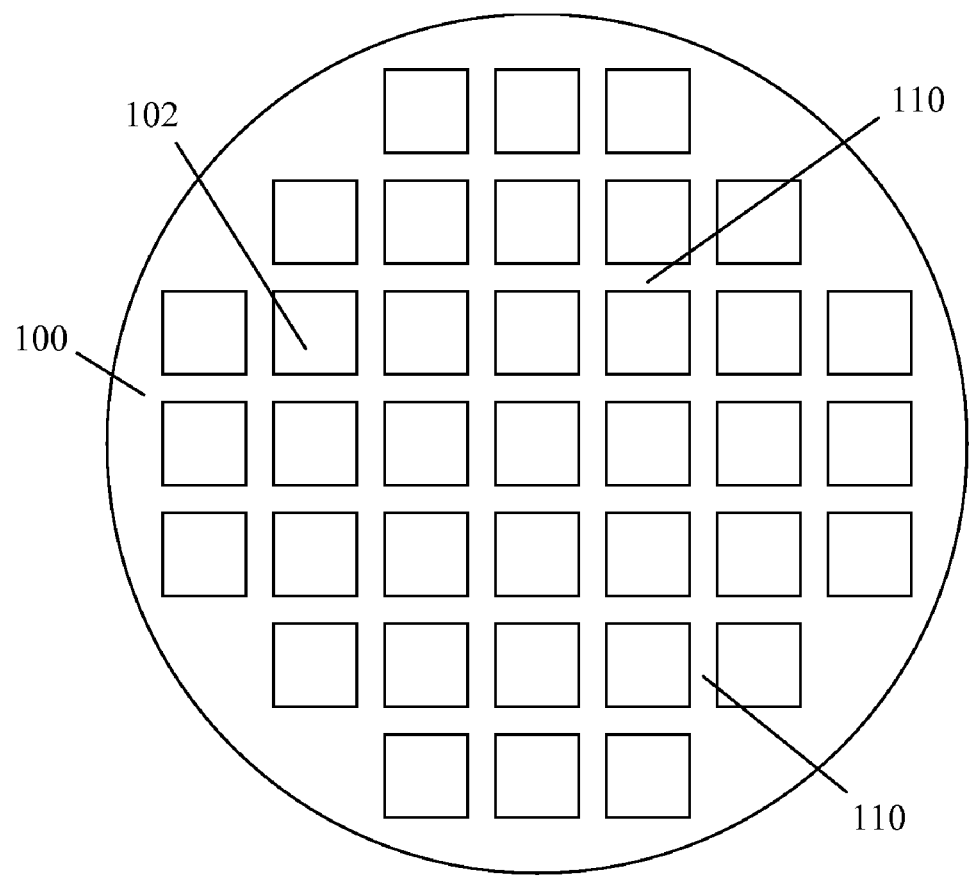
FIG. 4 schematically illustrates a substrate which has been imprinted by imprint templates according to an embodiment of the invention.
Figure 5:
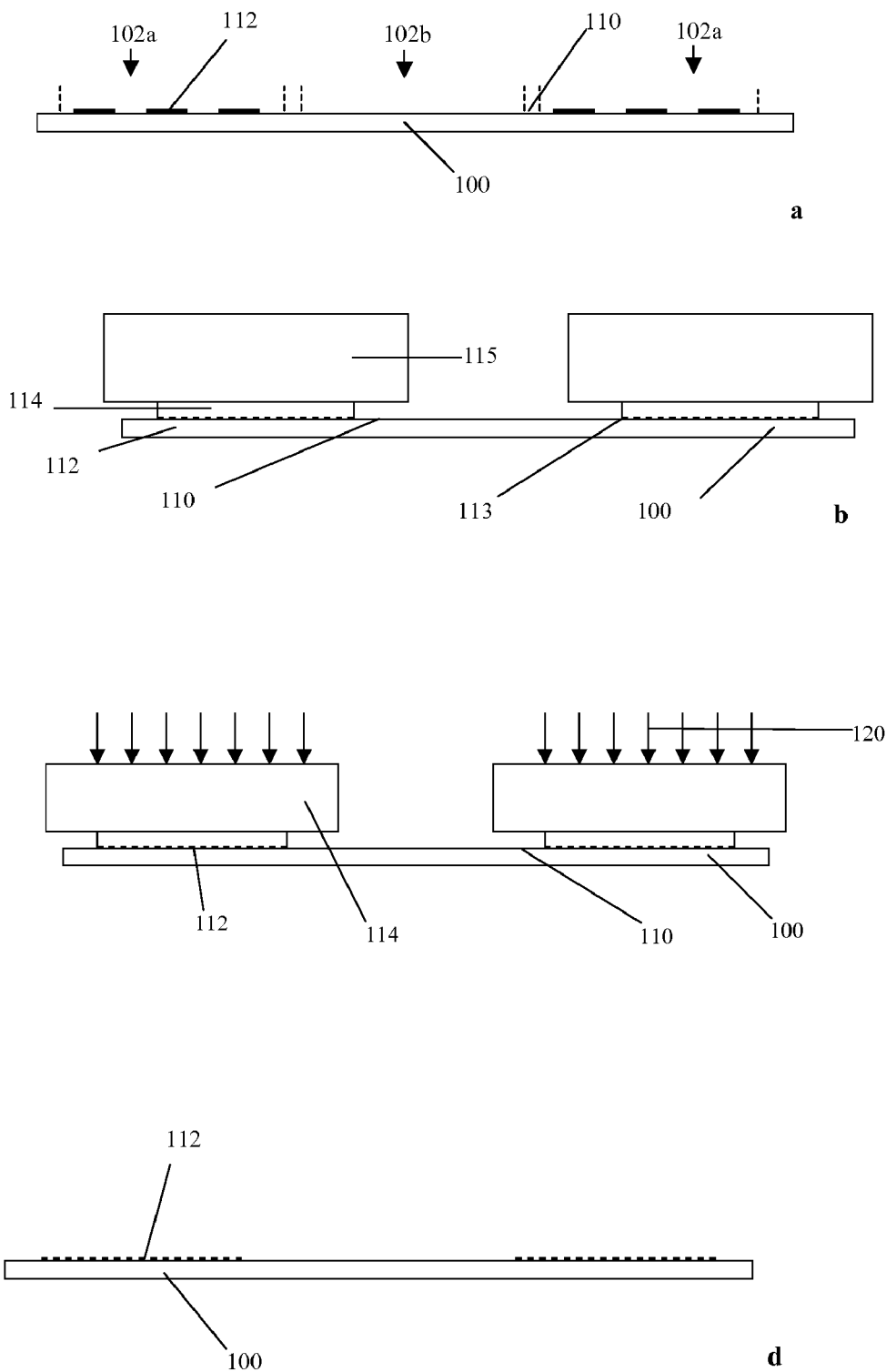
FIG. 5 schematically illustrates a substrate imprinting method according to an embodiment of the invention.

FIG. 4 shows schematically an arrangement whereby imprinting of a pattern onto a substrate may be performed quickly by imprinting large areas of the substrate at a time. The substrate 100 is imprinted with imprint areas 102. Each imprint area 102 may include a plurality of dies, with each die for example being separated from adjacent dies by scribe lanes. Individual dies are not illustrated in FIG. 4. The streets 110 between the imprint areas 102 may be used for process control purposes, and may also be used as scribe lanes. Referring to FIG. 5, a process whereby the imprint areas 102 may be imprinted onto the substrate 100 will now be described. A substrate 100 is provided, which substrate is typically either sufficiently flat to receive an imprint template or provided with a polished planarization layer. The substrate 100 is placed on a substrate table, which is movable in the x and y directions using electrical motors (the substrate table and motors are not illustrated for ease of understanding). In some instances the flatness of the substrate 100 may be measured by a sensor, and the substrate table may be adjusted to eliminate or reduce measured unflatness.

UV curable imprintable medium is inkjet printed onto some imprint areas 102a on the substrate 100 (delineated schematically by dotted lines). Other imprint areas 102b are not provided with imprintable medium, for reasons that will be explained below. The imprintable medium may be provided as discrete droplets 112 as shown schematically in FIG. 5a.

The provision of the imprintable medium 112 may conveniently be achieved by moving the substrate 100 to a different location using the motors which control the position of the substrate table. The imprintable medium may be provided by, for example, a stationary mounted single or multi-nozzle print head, or an ensemble of single or multi-nozzle print heads.

Once the imprintable medium 112 has been applied, the substrate may be moved to a different location in order to receive one or more imprint templates. It will be appreciated that in an alternative arrangement the substrate is not moved, and that the one or more imprint templates are moved to the location of the substrate. In a further alternative arrangement neither the substrate nor the imprint templates are moved to different locations.

Referring to FIG. 5b, imprint templates 114 held by template holders 115 are pressed against the substrate 100. It can be seen from FIG. 5b that the template holders occupy a significant amount of space, such that there is not sufficient space to provide an imprint template to imprint every imprint area 102a, 102b at the same time.

The imprint templates 114 are provided with sharp edges 113 which act to inhibit the imprintable medium 112 from flowing out from underneath the imprint templates. This is due to surface tension which pins the imprintable medium 112 at the sharp edges 113. Once the imprintable medium 112 has completely filled gaps between the imprint templates 114 and the substrate 100, the imprint template is prevented from moving further towards the substrate. This is because the surface tension inhibits the imprintable medium 112 from flowing out from underneath the imprint templates 114.

Referring to FIG. 5c, ultraviolet radiation 120 is directed to the imprintable medium 112 between the imprint templates 114 and the substrate 100. The imprint templates 114 are substantially transparent to ultraviolet radiation, and therefore transmit the ultraviolet radiation to the imprintable medium 112. The imprintable medium 112 is polymerized and solidified by the ultraviolet radiation 120. In one arrangement, the ultraviolet radiation may be provided at a dedicated location within the lithographic apparatus, the substrate 100 and templates 114 being moved to that location to allow it to be illuminated by the ultraviolet radiation, and then subsequently moved to a different location. In an alternative arrangement, the ultraviolet radiation may be administered to the imprintable medium 112 on the substrate 100 without moving the substrate to a different location.

Referring to FIG. 5d, the imprint templates 114 are removed from the substrate 100, leaving behind a patterned layer of polymerized imprintable medium 112. The imprint process is then repeated, to allow patterns to be imprinted onto the remaining imprint areas (e.g. 102b).

Figure 6:
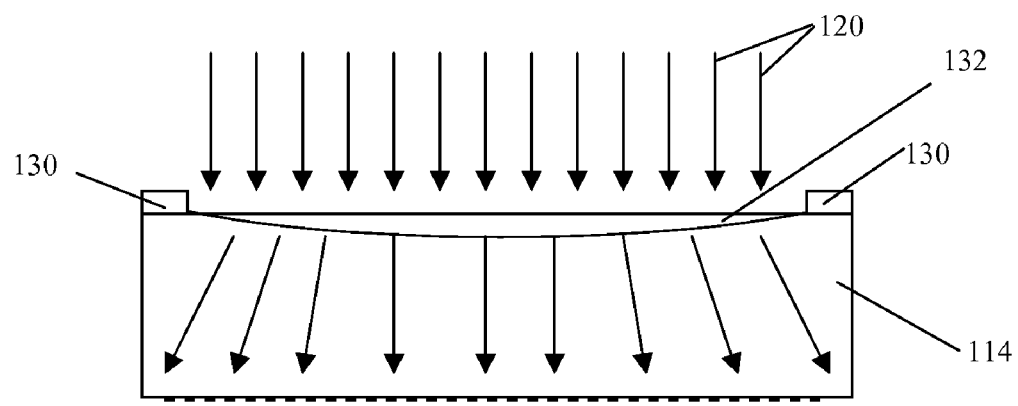
FIGS. 6, 7a, 7b and 8 schematically illustrate imprint templates according to embodiments of the invention.

In some instances it may be desired to provide imprint templates very close to one another, i.e. with a street size which is very narrow (for example as little as 100 microns). A suitable imprint template for achieving this is shown schematically in FIG. 6. Referring to FIG. 6, an imprint template 114 may be provided with gripping handles 130 at a perimeter of the imprint template. The gripping handles 130 allow a template holder (not illustrated) to securely engage with the imprint template 114.

To ensure that ultraviolet radiation 120 passes to imprintable medium located beneath all parts of the imprint template 114, an uppermost surface of the imprint template is provided with a plano-convex lens 132. As shown schematically in FIG. 6, the plano-convex lens 132 directs the ultraviolet radiation 120 to all parts of a lowermost surface of the imprint template 114.

The method described above is particularly suited for imprinting a first patterned layer onto a substrate. Where this is done, there is no requirement to align the pattern to a pattern previously provided on the substrate. Some low accuracy knowledge of the position of the substrate 100 is useful in order to ensure that the areas of imprintable medium 112 and the streets of anti-wetting coating 110 are correctly located, and for example do not overlap with one another.

Figure 7A:
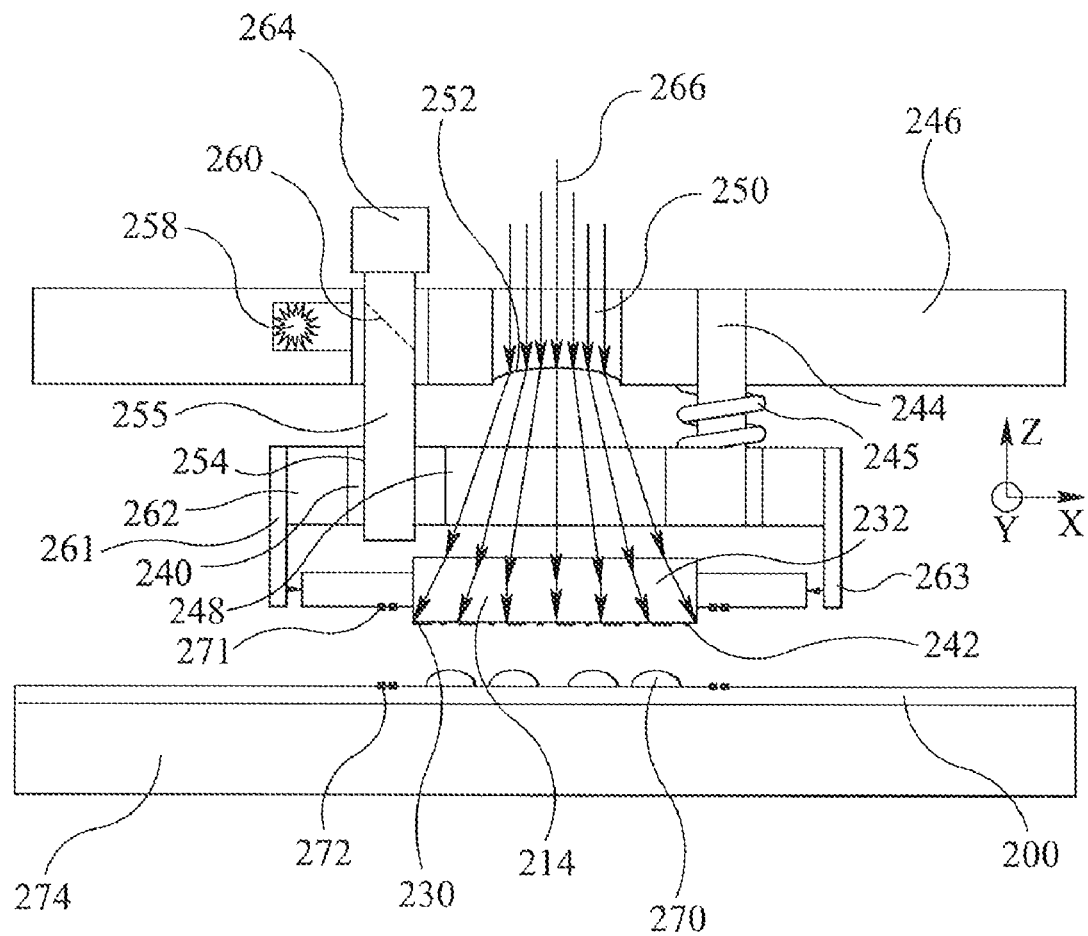
Figure 7B:
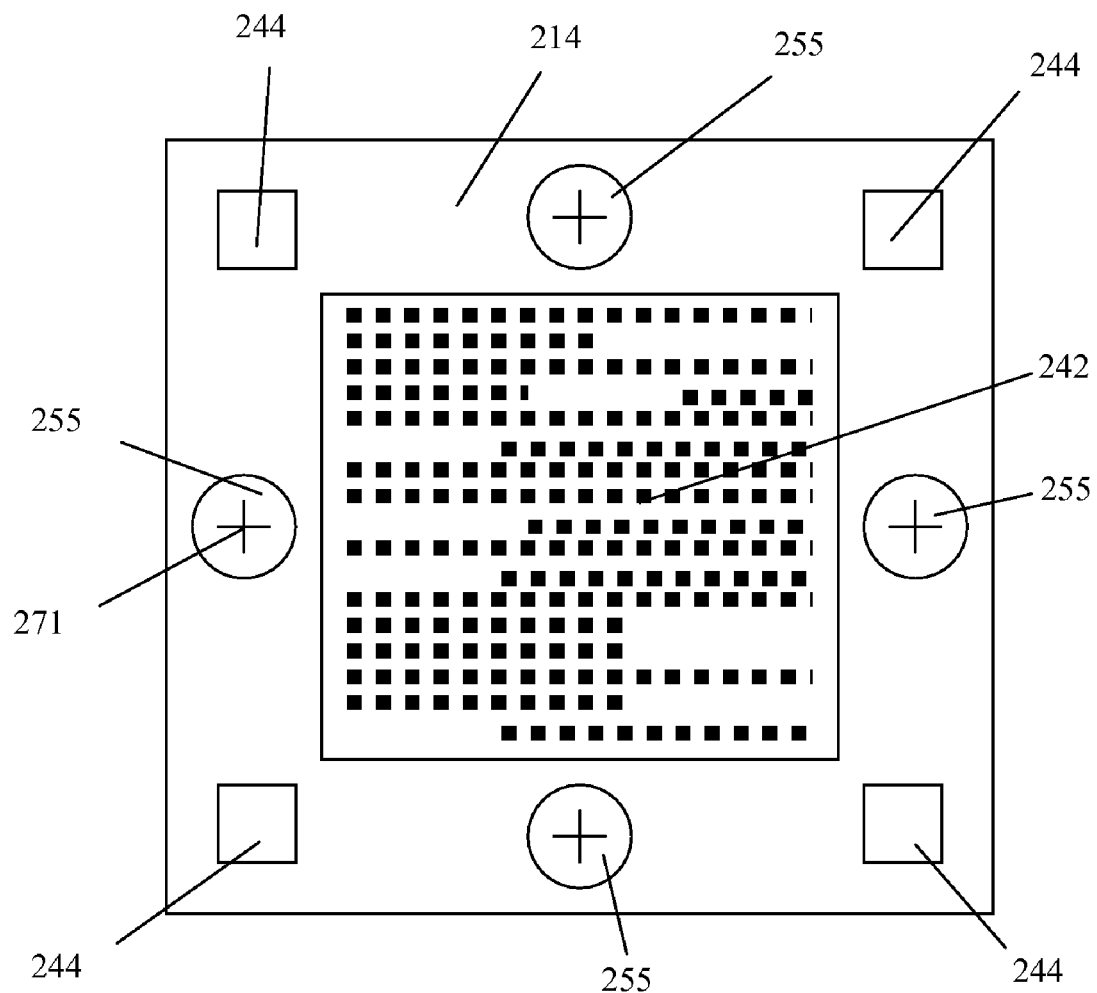

FIG. 7 shows schematically an imprint template 214 which may be used to imprint a pattern which is aligned with a pattern previously provided on a substrate. FIG. 7a is a cross-section of the imprint template 214, and FIG. 7b is the imprint template 214 from below. In order to facilitate understanding of the embodiment of the invention, the cross section shown in FIG. 7a is not strict, rather includes elements that would not be visible in a strict cross section.

The imprint template 214 is attached to a template holder 240, and has a lowermost surface which is provided with a pattern 242. The imprint template 214 and template holder 240 are attached via four actuators 244 (of which one is shown in FIG. 7a and all four shown in FIG. 7b) to a support 246. The actuators 244 are, for example, piezoelectric actuators, and are capable of movement in the z-direction. The actuators 244 will hereafter be referred to as imprint actuators 244. The imprint template 214 is constructed from quartz, fused silica or optical grade polyolefin. The template holder is made from stress free stainless steel or a comb-like structure 263, and is connected via piezoelectric actuators 262, which are capable of movement in the x and y directions, to the template holder 240. The form of the imprint template 214 can be adapted to elastically by the piezoelectric actuators 262. The piezoelectric actuators 262 will hereafter be referred to as alignment actuators 262.

A central region of the imprint template 214 is provided with a plano-concave lens 232. A correspondingly dimensioned central portion of the template holder 240 is cut away to provide an opening 248. A central portion of the support 246 is provided with an opening 250, within which is a plano-concave lens 252. The opening 250 in the support 246 is substantially co-axial with the opening 248 in the template holder 240.

Four cylindrical bores 254 are provided in the template holder 240 and the support structure 246. An optics holding container of an alignment system 255 is provided in each cylindrical bore 254 (plus associated transversely oriented recesses). The alignment system 255 comprises a radiation source 258 and a semi-transparent mirror 260 arranged to direct radiation through alignment optics (not shown) in the optics holding container(s). The radiation source 258 may, for example, comprise a light emitting diode, or may alternatively be a white light source. A CCD camera 264 is located above the semi-transparent mirror 260 above the alignment optics. The CCD camera receives radiation which has passed through the alignment optics onto a substrate 200, and has been reflected back through the alignment optics and through the semi-transparent mirror 260. It will be appreciated that the CCD camera is an example of an image sensor, and other suitable image sensors may be used. Alignment and magnification correction are guided by alignment marks 272 on the substrate 100 and corresponding alignment marks 271 on the imprint template 214.

The alignment system 255 allows for high precision alignment of the imprint template pattern 242 with a pattern previously provided on the substrate 200, using the alignment actuators 262.

Operation of the imprint template 214 shown in FIG. 7 will now be described. It should be borne in mind that several imprint templates may be provided on the support 246. Indeed, a sufficient number of imprint templates may be provided to allow an entire substrate to be imprinted at one time.

Imprintable medium 270 is applied to the substrate 200, for example using ink jet printing to provide the imprintable medium in a certain pattern. This may be done by using a substrate table 274 to move the substrate 200 to another location, for example an imprintable medium application location. Further different locations may be used to measure the flatness of the substrate 200, and to imprint a pattern onto the substrate.

The substrate 200 is then located beneath the imprint template 214. The imprint template 214 is moved downwards and/or the substrate 200 is moved upwards until the imprint template is located around 10 microns above the substrate 200. The imprint actuators 244 push the imprint template 214 onto the substrate 200 with a controlled force. At the moment the imprint layer is completely formed the force needed to push the template further down increases considerably. This is because sharp edges 230 of the imprint template 214 inhibit imprintable medium from flowing beyond the imprint template. This change in force is used in a closed loop control set-up for leveling the imprint template 214 with respect to the substrate 200.

When the gap between the imprint template 214 and the substrate 200 is sufficiently small, alignment marks 272 provided on the substrate 200 and the corresponding alignment marks 271 on the imprint template 214 are both in focus and recorded by the alignment optics 255 and the CCD camera 264. Alignment of the imprint template 214 to the substrate alignment marks 272 is then performed. This is done by comparing the location of substrate alignment marks 272 with fiducial alignment marks 271 using the CCD camera 264, and actuating the alignment actuators 262 in the x and y directions appropriately. Some movement of the imprint actuators 244 may also be used during alignment. Some elastic deformation of the imprint template 214 and the template holder 240 will take place. The elastic deformation is such that the flatness of the lowermost surface of the imprint template 214 is not significantly changed.

Where three or more alignment marks located at different positions on the substrate 200 are used, adjustment by the alignment actuators 262 may include magnification correction (i.e. making the imprint template 214 larger or smaller).

Once alignment of the imprint template 214 to the substrate 200 has been completed, ultraviolet radiation 266 is directed through the imprint template onto the imprintable medium 270, such that the imprintable medium polymerizes and solidifies. The ultraviolet radiation 266 passes through the opening 250, through the piano-concave lens 252 and the plano-concave lens 232. The ultraviolet radiation then passes via the imprint template 214 onto the imprintable medium 270 provided on the substrate 200. The ultraviolet radiation has an intensity distribution which is arranged such that the intensity of ultraviolet radiation incident upon the imprintable medium 270 is substantially uniform. The intensity of the UV beam on passing into the support 246 is lower at a central portion of the radiation and has a higher intensity at its edges, such that when the ultraviolet radiation is directed outwards by the lenses 252, 232 the intensity of the ultraviolet radiation becomes substantially uniform.

Once the imprintable medium 270 has polymerized and solidified, the imprint template is removed from the substrate 200 by using the imprint actuators 244 to draw the imprint template 214 upwards. The solidified imprintable medium 270 retains a pattern imprinted by the imprint template 214.

Although only one imprint template 214 is visible in FIG. 7, it will be understood that a plurality of imprint templates may be provided together. For example, sufficient imprint templates may be provided to allow an entire substrate to be imprinted with a pattern at one time.

Although FIG. 7 shows parts of the alignment system 255 as being located in the template holder 240, it will be appreciated that the alignment system may provided in different locations. For example, the alignment system may be provided in the template holder only, the template holder being arranged such that it extends along sides of the imprint template 214. In a further example, the alignment system may be provided in the template holder and the support 246.

Figure 8:
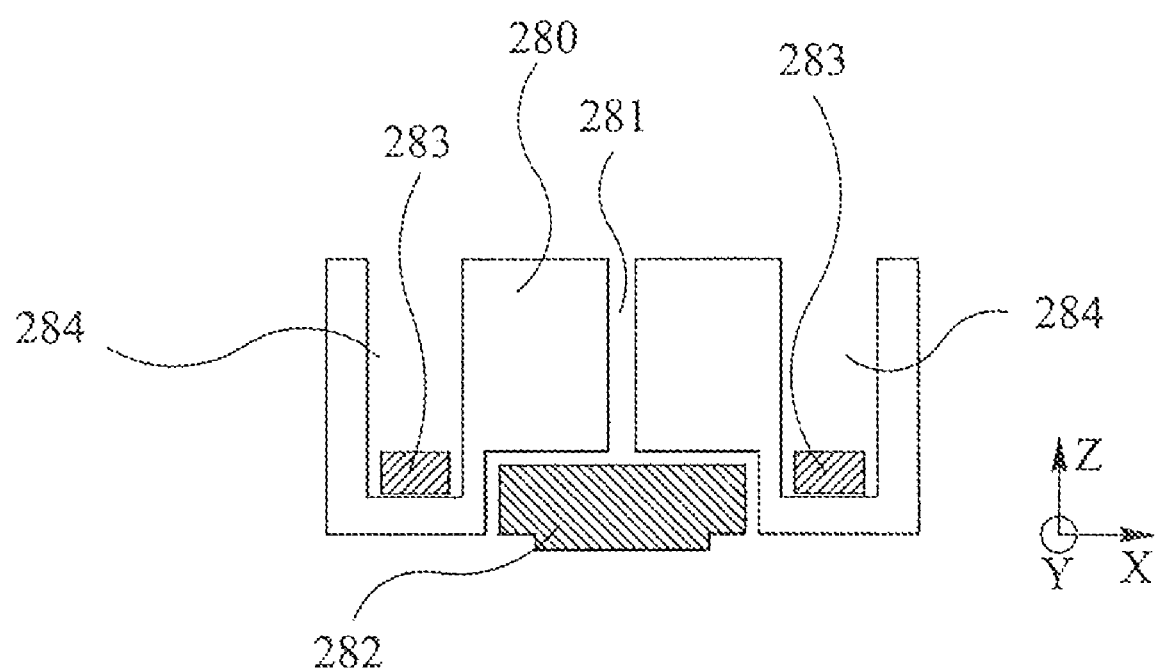

FIG. 8 shows an alternative template holder 280. The template holder 280 is fabricated from Zerodur ceramic (made by Schott A.G.), but may be fabricated from any other suitable material. The template holder 280 is provided with a channel 281 through which a low pressure is applied which is used to hold an imprint template 282. Piezo actuators 283 are provided in recesses 284 located on either side of the imprint template 282. The piezo actuators 283 are connected between different parts of the template holder, and may be used to stretch or compress the template holder 280 in the x and y directions. This in turn stretches or compresses the imprint template 282. This may be done in order to match the imprint template 282 to a pattern already present on a substrate to be imprinted. A plurality of piezo actuators may be provided to each side of the imprint template 282. This will assist in adjusting the imprint template to match, for example, distortion present in the pattern on the substrate. The template holder 280 may be provided with one or more of the features described above in relation to FIG. 7.

The separation between adjacent areas to be imprinted may be small, for example around 100 microns or less, and this may render it difficult to individually attach all imprint templates to, for example, a support (there may not be sufficient space for suitable attachment means to be provided). A further or alternative problem which may arise is that the forces required in order to remove all of the imprint templates from the substrate following polymerization of the imprintable medium may be so large that they cause the substrate to become damaged.

A template holder may extend laterally into adjacent regions which are to be imprinted. Referring to FIG. 9a, a template holder 301 may be arranged such that it only extends into four adjacent regions, and does not extend beyond the center of those regions, i.e., occupy as much space so as to extend almost halfway into the neighboring imprint fields. This allows an array of template holders (and associated imprint templates) to be used at the same time to imprint into an array of regions. Dark gray/black shading is used in FIG. 9a to indicate the regions that may be imprinted simultaneously.

Four imprints are required in order to substantially fully cover the surface of a substrate 300, and these are illustrated schematically in FIGS. 9a to 9d. Following the first imprint, regions which are diagonally adjacent the imprinted regions are imprinted using a second array of imprint templates, as shown in FIG. 9b. To aid understanding, the regions that are currently being imprinted are represented in dark gray/black, the regions that have already been imprinted are represented in intermediate gray, and the regions not yet imprinted are represented by light gray.

A third imprint, by a third array of imprint templates, is represented in FIG. 9c, dark gray/black again being used to represent those regions that are currently being imprinted, intermediate gray again being used to represent regions that have already been imprinted, and light gray again being used to represent regions not yet imprinted. A fourth imprint by a fourth array of imprint templates is represented in FIG. 9d, dark gray/black again being used to represent those regions that are currently being imprinted and intermediate gray again being used to represent regions that have already been imprinted.

Each of the imprints shown in FIGS. 9a to 9d may be performed by moving each array of imprint templates in turn to be over the substrate 300 and then imprinting the substrate. Alternatively, the arrays of imprint templates may remain in specific locations, with the substrate being moved between the arrays of imprint templates. Where this is done, imprinting may be performed in parallel, for example with a first substrate being imprinted by the first array of imprint templates, and the second substrate being imprinted by the second array of imprint templates, etc. A combination of moving the arrays of imprint templates and moving the substrates may also be used (for example, allowing two substrates to be imprinted in parallel rather than four).

Figure 9:
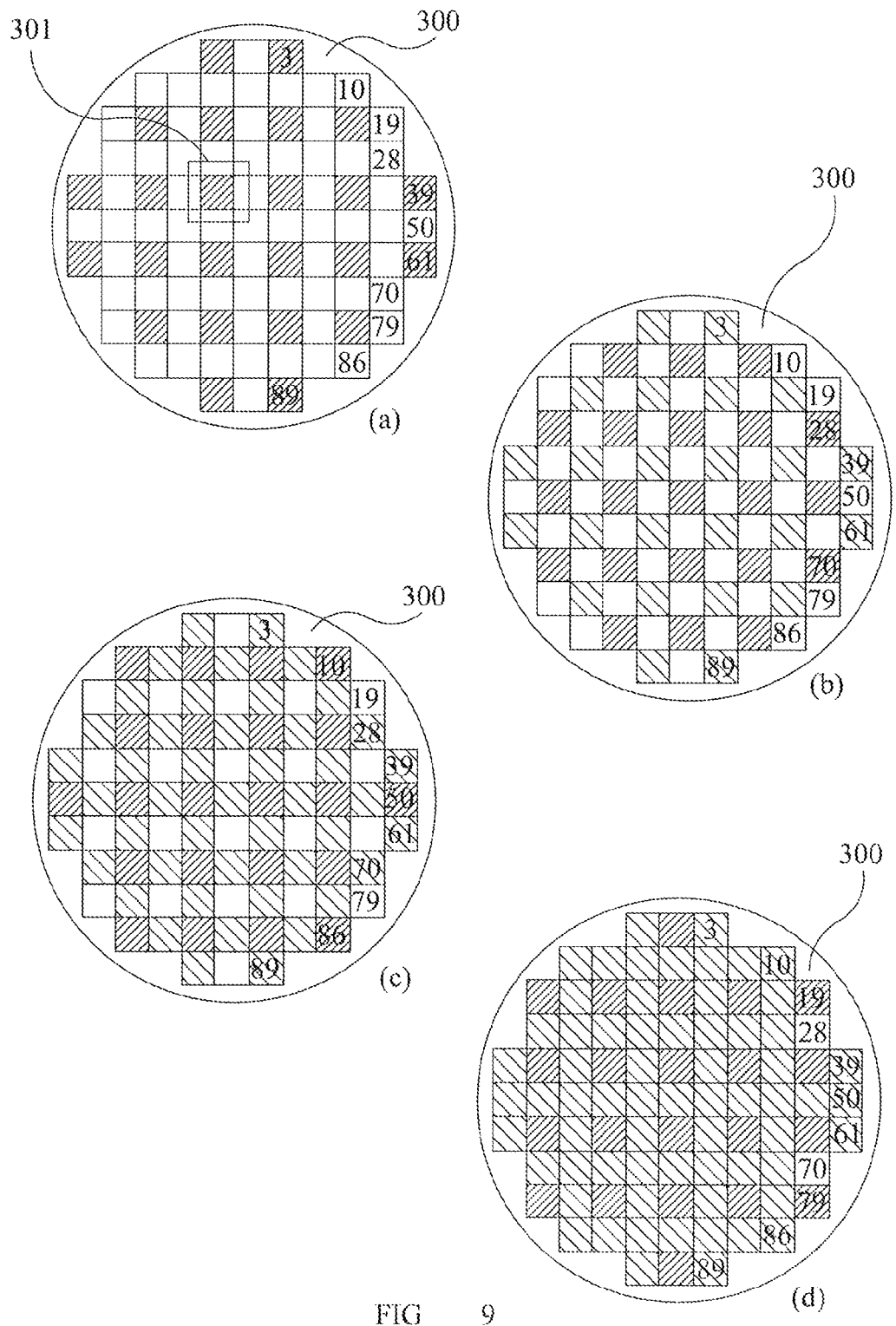
FIG. 9 schematically illustrates substrates which have been imprinted by arrays of imprint templates according to an embodiment of the invention.

It is not essential that the template holder exactly occupies the space illustrated in FIG. 9. Rather, it is preferred that the template holder falls within a footprint defined by the shape shown in FIG. 9 (the template holders may, for example, be smaller than the shape).

It will be understood by those skilled in the art that the template holders may be designed such that they occupy spaces which differ from those illustrated in FIG. 9. For example, the template holder shown in FIG. 9a may be rotated through 45 degrees, such that it does not overlap with diagonally adjacent regions. Alternatively, the template holder may be provided on only two sides of the imprint template, for example such that it extends into only two adjacent regions. Other alternative sizes and shapes of the spaces occupied by the template holder will be apparent to those skilled in the art. In some instances a different number of imprints being required.

The imprint templates referred to above may, for example, be constructed from optical grade polyolefin or, if only very small elastic deformation of the imprint template is desired, from quartz glass. The pattern provided in an imprint template may be written by an electron beam pattern generator in resist, followed by an etch step. An alternative method of making an imprint template comprises using an electron beam pattern generator to provide a pattern on a nickel stamp, then using precision injection molding to form the imprint templates. This is similar to the manufacturing process used to make compact discs. The plano-concave lens 132 and gripping handles 130 shown in FIG. 6, may be included when injection molding the imprint template.

Although the above description refers to ultraviolet radiation it will be appreciated that, as explained further above, any suitable actinic radiation may be used.

While specific examples of the invention have been described above, it will be appreciated that the present invention may be practiced otherwise than as described. The description is not intended to limit the invention.

The invention claimed is:

1. An imprint lithography apparatus comprising:
a first array of template holders,
a second array of template holders,
a substrate table arranged to support a substrate to be imprinted, wherein the first array of template holders is arranged to hold a first array of imprint templates that can be used to imprint a first array of patterns onto the substrate, and the second array of template holders is arranged to hold a second array of imprint templates that can be used to imprint a second array of patterns onto the substrate,
a motor configured to control movement of the substrate table, an actuator configured to control movement of the first array of imprint templates and/or an actuator configured to control movement of the second array of imprint templates, the motor, the actuator of the first array of imprint templates, and/or the actuator of the second array of imprint templates configured to control the patterns imprinted by the second array of imprint templates being interspersed between the patterns imprinted by the first array of imprint templates and the patterns imprinted by the second array of imprint templates being imprinted after the patterns imprinted by the first array of imprint templates between which the respective patterns of the second array of imprint templates are interspersed.

2. The apparatus of claim 1, wherein the apparatus further comprises a third array of template holders arranged to hold a third array of imprint templates that can be used to imprint a third array of patterns onto the substrate, the patterns imprinted by the third array of imprint templates being interspersed between the patterns imprinted by the first and second arrays of imprint templates.

3. The apparatus of claim 2, wherein the apparatus further comprises a fourth array of template holders arranged to hold a fourth array of imprint templates that can be used to imprint a fourth array of patterns onto the substrate, the patterns imprinted by the fourth array of imprint templates being interspersed between the patterns imprinted by the first, second and third arrays of imprint templates.

4. The apparatus of claim 1, wherein the first and second arrays of template holders are in fixed locations, and the substrate is moveable between the first and second arrays of template holders.

5. The apparatus of claim 2, wherein the first, second and third arrays of template holders are in fixed locations, and the substrate is moveable between the first, second and third arrays of template holders.

6. The apparatus of claim 1, further comprising imprint templates held by the arrays of template holders, at least some of the imprint templates each comprising a lens arranged to direct radiation through the imprint template such that the radiation reaches substantially all regions of a substrate which is to be exposed to the radiation.

7. The apparatus of claim 6, wherein the lens is a plano-concave lens.

8. The apparatus of claim 6, wherein the lens is provided in an uppermost surface of the imprint template.

9. The apparatus of claim 1, further comprising a support configured to hold the template holders, the support comprising a plurality of lenses arranged to direct radiation towards the imprint template with a desired intensity distribution.

10. The apparatus of claim 9, wherein the lenses are plano-concave lenses.

11. The apparatus of claim 1, further comprising imprint templates held by the arrays of template holders, at least some of the imprint templates each comprising at least part of an alignment system.

12. The apparatus of claim 11, wherein the alignment system comprises an image sensor.

13. The apparatus of claim 1, wherein at least some of the template holders comprise at least part of an alignment system.

14. The apparatus of claim 13, wherein the alignment system comprises an image sensor.

15. An imprint lithography apparatus comprising:
a plurality of arrays of template holders, wherein each array:
(i) comprises a plurality of template holders,
(ii) is arranged to hold an array of imprint templates used to imprint an array of patterns onto a substrate, and
(iii) is at a different separate location from an other array of the template holders; and
a substrate table arranged to support the substrate to be imprinted and to move from one array of template holders where the substrate is directly opposite the one array but not an other array of template holders such that the one array of template holders imprint the substrate to the other array of template holders such the substrate is directly opposite the other array but not the one array such that the other array of template holders imprint the substrate.

16. The apparatus of claim 15, wherein the plurality of arrays comprises a first array of template holders and a second array of template holders and is configured to imprint patterns by the second array after and interspersed between patterns imprinted by the first array.

17. The apparatus of claim 15, wherein the plurality of arrays of template holders comprises at least four arrays of template holders.

18. The apparatus of claim 15, wherein the plurality of template holders are arranged in a two dimensional array.

19. The apparatus of claim 15, wherein each template holder is arranged to imprint a respective template held by the template holder onto a substrate and has a footprint that includes the imprint area of the respective template and an area of a portion of an adjacent imprint area.

20. An imprint lithography apparatus, comprising:
a plurality of template holders, each template holder
(i) arranged to imprint a respective template held by the template holder on a substrate, and
(ii) having a footprint that includes the imprint area of the respective template and an area of a portion of an adjacent imprint area when the respective template contacts the imprint area of the respective template; and an actuators configured to control movement of the templates of the template holders and/or a motor configured to control movement of the substrate, the actuator and/or motor configured to cause the respective template to contact the imprint area of the respective template and to subsequently cause the respective template or another template to contact the portion of the adjacent imprint area.

21. The apparatus of claim 20, wherein the plurality of template holders are arranged in a two dimensional array.

22. The apparatus of claim 20, wherein each template holder has at least part of an alignment system.

* * * * *